(12) United States Patent
Kwon et al.

(10) Patent No.: US 7,531,456 B2
(45) Date of Patent: May 12, 2009

(54) METHOD OF FORMING SELF-ALIGNED DOUBLE PATTERN

(75) Inventors: Byoung-Ho Kwon, Suwon-si (KR); Se-Rah Yun, Suwon-si (KR); Chang-Ki Hong, Seongnam-si (KR); Bo-Un Yoon, Seoul (KR); Jae-Kwang Choi, Suwon-si (KR); Joon-Sang Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 59 days.

(21) Appl. No.: 11/602,270

(22) Filed: Nov. 21, 2006

(65) Prior Publication Data

US 2007/0148968 A1 Jun. 28, 2007

(30) Foreign Application Priority Data

Dec. 26, 2005 (KR) ............. 10-2005-0129928

(51) Int. Cl.
*H01L 21/44* (2006.01)
(52) U.S. Cl. .............. 438/671; 438/736; 438/737; 438/738; 438/925
(58) Field of Classification Search ........... 438/671, 438/736–738, 952
See application file for complete search history.

(56) References Cited

U.S. PATENT DOCUMENTS

| 6,063,688 | A | * | 5/2000 | Doyle et al. | 438/424 |
| 6,638,441 | B2 | | 10/2003 | Chang | |
| 7,183,142 | B2 | * | 2/2007 | Anderson et al. | 438/142 |
| 7,205,232 | B2 | * | 4/2007 | Yun et al. | 438/671 |
| 7,297,638 | B2 | * | 11/2007 | An et al. | 438/717 |
| 2007/0123053 | A1 | * | 5/2007 | Kim et al. | 438/736 |
| 2008/0076071 | A1 | * | 3/2008 | Lim et al. | 430/311 |
| 2008/0081461 | A1 | * | 4/2008 | Lee et al. | 438/637 |

FOREIGN PATENT DOCUMENTS

| KR | 10-0165399 | 2/1999 |
| KR | 10-0281891 | 4/2001 |

* cited by examiner

*Primary Examiner*—Andy Huynh
(74) *Attorney, Agent, or Firm*—Harness, Dickey & Pierce

(57) ABSTRACT

Mask patterns used for forming patterns or trenches may include first mask patterns, which may be formed by a typical photolithography process, and second mask patterns, which may be formed in a self-aligned manner between adjacent first mask patterns. A sacrificial layer may be deposited and planarized such that the tops of the first mask patterns and the second mask patterns have planar surfaces. After the planarization of the sacrificial layer, the remaining the sacrificial layer may be removed by an ashing process.

23 Claims, 6 Drawing Sheets

METHOD OF FORMING SELF-ALIGNED DOUBLE PATTERN

A claim of priority is made to Korean Patent Application No. 2005-129928, filed on Dec. 26, 2005, the disclosure of which is incorporated herein by reference in its entirety.

BACKGROUND OF THE INVENTION

1. Field of the Invention

Example embodiments of the present invention relate to a method of forming a pattern, and more particularly, to a method of forming a self-aligned double pattern.

2. Description of Related Art

Due to an increased demand for highly integrated semiconductor memory devices, techniques of integrating more devices onto a small area have become strongly relied upon. The integration of many devices onto a small area involves downscaling the devices to be formed on a semiconductor substrate. However, the downscaling of the devices has a limit. The wavelength of a light source used in a photolithography process, which determines the dimensions of a device, is reaching technical limitations.

A KrF eximer laser and an ArF eximer laser may be used as light sources during the photolithography process. The ArF eximer laser has a wavelength of 193 nm and a feature size of 0.07 to 0.15 μm, and the KrF eximer laser has a wavelength of 248 nm and a feature size of 0.13 to 0.25 μm. In addition to KrF and ArF, a mercury lamp, for example, an I-line or a G-line, may be used as a light source during the photolithography process.

By using a light source with a short wavelength, fine patterns may be formed due to higher resolution. However, currently there is no available photoresist, which can absorb a light source having a short wavelength and enable chemical amplification. To make use of a light source with a short wavelength, it is necessary to develop photoresist that is photosensitive to short wavelength.

To overcome this drawback, a method of forming a self-aligned double pattern has been developed. The method may utilize the resolution capabilities of a photolithography apparatus to form a pattern twice as integrated as a conventional pattern.

For example, there is a first conventional method of forming a metal pattern. The method may include sequentially forming a first conductive layer pattern, a first insulating layer pattern, a second conductive layer pattern, and a second insulating layer pattern on a substrate. Etching may be performed using the second insulating layer pattern as an etch mask. A third insulating layer pattern may fill spaces between the second insulating layer patterns formed by the etching process. The second conductive layer pattern may be formed between the first conductive layer pattern with a pitch equal to the resolution limit, thereby completing a self-aligned double pattern.

A second conventional method may include forming an interconnection pattern for a semiconductor device. A first interconnection pattern may be formed, and an insulating layer may be coated on and between the first interconnection patterns. The insulating layer may be formed to a thickness equal to the depth of an over-etched portion under the first interconnection pattern. Also, an interconnection material layer may be formed on the insulating layer. A planarization process may be performed on the interconnection material layer, thereby forming a second interconnection pattern between the first interconnection patterns.

There is also a third conventional method for pitch reduction. A photoresist pattern may be formed, and a dielectric layer may be formed on the photoresist pattern. An anisotropically etch backed process may be performed on the dielectric layer to expose a substrate under the dielectric layer. Also, a bottom anti-reflection coating (ARC) layer may be formed between the dielectric layer and the substrate. The photoresist pattern may be removed. A portion from which the photoresist pattern is removed may be filled with another ARC layer and another dielectric layer, and the resultant structure may be planarized. By this process, a dielectric layer pattern twice as dense as the photoresist pattern may be formed on the substrate.

However, the above-described techniques have several problems. For example, in the first conventional method, resulting metal patterns may not form a planar surface. In the second conventional method, electrical connection between the second interconnection pattern and a substrate may be impeded. The third conventional method is a complicated patterning method, which includes a plurality of sacrificial processes, and precludes the formation of dielectric patterns.

SUMMARY OF THE INVENTION

Example embodiments of the present invention may provide a method of forming a self-aligned double pattern using a sacrificial layer.

In an example embodiment of the present invention, a method of forming a self-aligned double pattern may include providing a substrate, forming an underlying layer on the substrate, and forming a first mask pattern on the underlying layer. The method may further include forming a first sacrificial layer on the first mask pattern and the underlying layer, forming a second mask pattern on the first sacrificial layer, etching the first sacrificial layer to form a first sacrificial pattern, forming a second sacrificial layer on the first mask pattern, the second mask pattern, and the underlying layer. The method may also include planarizing the second sacrificial layer such that top surfaces of the first mask pattern and the second mask pattern are planar, removing the second sacrificial layer, and forming an underlying layer pattern by etching the underlying layer using the first mask pattern, the second mask pattern, and the first sacrificial pattern as an etching mask.

In another example embodiment of the present invention, a method of forming a self-aligned double pattern may include providing a substrate, forming a first mask pattern on the substrate, forming a first sacrificial layer on the first mask pattern and the substrate, forming a second mask pattern on the first sacrificial layer, and etching the first sacrificial layer to form a first sacrificial pattern. The method may further include forming a second sacrificial layer on the first mask pattern, the second mask pattern, and the substrate, planarizing the second sacrificial layer such that top surfaces of the first mask pattern and the second mask pattern are planar, removing the second sacrificial layer, and forming a trench by an etching process using the first mask pattern and the second mask pattern as an etching mask.

BRIEF DESCRIPTION OF THE DRAWINGS

The foregoing and other aspects of example embodiments will be apparent from the more detailed description and the accompanying drawings. The drawings are not necessarily to scale, emphasis instead being placed upon illustrating the principles of example embodiments.

DETAILED DESCRPTION OF EXAMPLE EMBODIMENTS

Figure 1A:
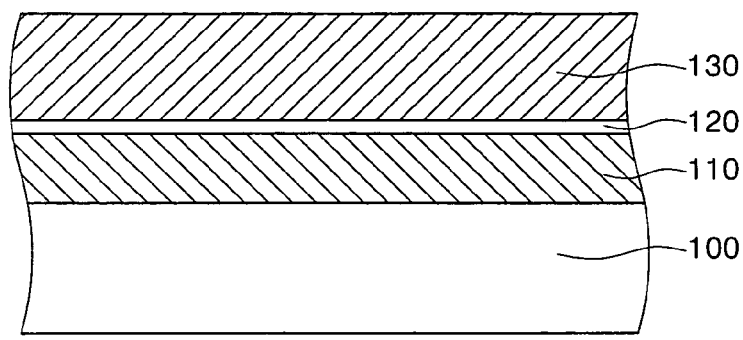
FIGS. 1A through 1H are cross-sectional views illustrating a method of forming a self-aligned double pattern according to an example embodiment of the present invention.

Example embodiments will now be described more fully hereinafter with reference to the accompanying drawings.

It will be understood that when an element or layer is referred to as being "on", "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there may be no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that may be schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1A through 1H are cross-sectional views illustrating a method of forming a self-aligned double pattern according to an example embodiment of the present invention.

Referring to FIG. 1A, a semiconductor substrate 100 may be provided. An underlying layer 110 may be formed on a semiconductor substrate 100, and a first mask layer 130 may be formed on the underlying layer 110. A silicon nitride (SiN) layer 120 may be interposed between the underlying layer 110 and the first mask layer 130. The underlying layer 110 may be patterned during a subsequent process, and the first mask layer 130 may be used as an etch mask while patterning the underlying layer 110. A photoresist (not shown) may be coated on the first mask layer 130, and a typical photolithography process may be performed to form a photoresist pattern (not shown).

Figure 1B:
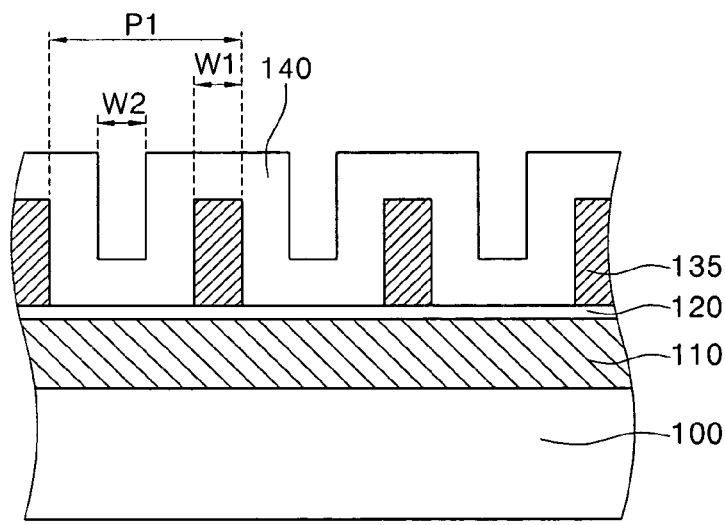

Referring to FIG. 1B, the first mask layer 130 may be etched using the photoresist pattern as an etch mask, thereby forming a first mask pattern 135. During the etching process to form the first mask pattern 135, the silicon nitride layer 120 may function as an etch stop layer. If the silicon nitride layer 120 is not interposed between the underlying layer 110 and the first mask pattern 135, a sacrificial layer 140 may be formed on exposed portions of the underlying layer 110 and on the first mask pattern 135. The sacrificial layer 140 may be conformably formed on the substrate 100 having the first mask pattern 135. In other words, the sacrificial layer 140 may be formed on the first mask pattern 135 and the exposed portions of the silicon nitride layer 120.

A width W1 of the first mask pattern 135 may be ¼ a pitch P1 between the first mask patterns 135. Also, a width W2 between sidewalls of the sacrificial layer 140 may be ¼ the pitch P1 between the first mask patterns 135.

Figure 1C:
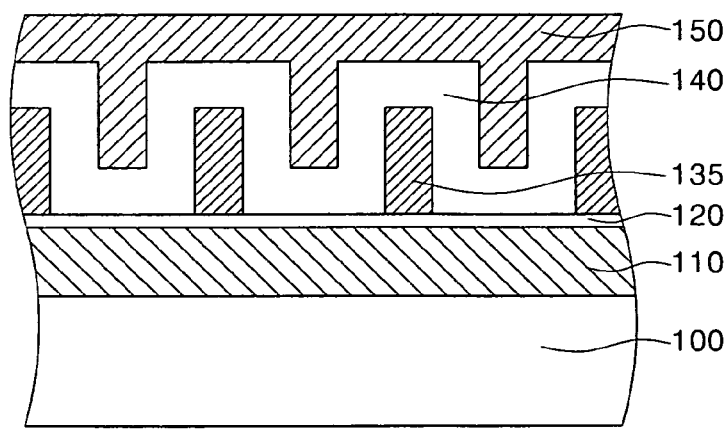

Referring to FIG. 1C, a second mask layer 150 may be formed on the substrate 100 having the sacrificial layer 140. The sacrificial layer 140 may be formed of a material having an etch selectivity with respect to the first mask pattern 135 and the second mask layer 150. The second mask layer 150 may be formed of the same material as the first mask pattern 135.

Figure 1D:
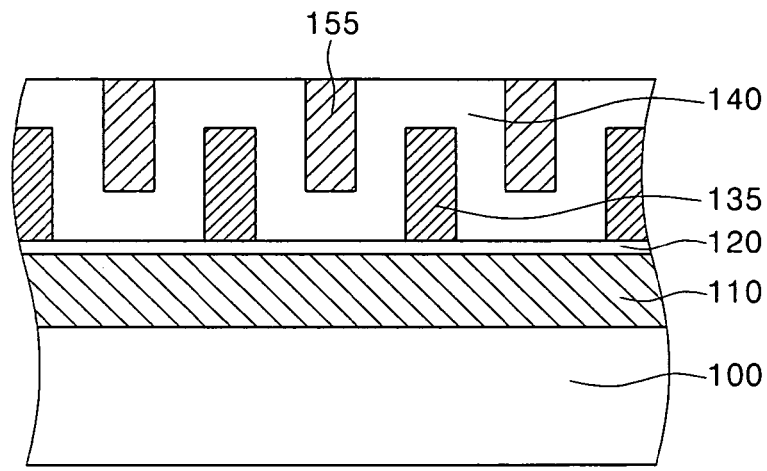

Referring to FIG. 1D, the second mask layer 150 may be planarized to expose the upper surface of the sacrificial layer 140, thereby forming a second mask pattern 155. In other words, the second mask pattern 155 may fill the sidewalls of the sacrificial layer 140. The planarization of the second mask layer 150 may be performed using a chemical mechanical polishing (CMP) process or an etchback process.

Figure 1E:
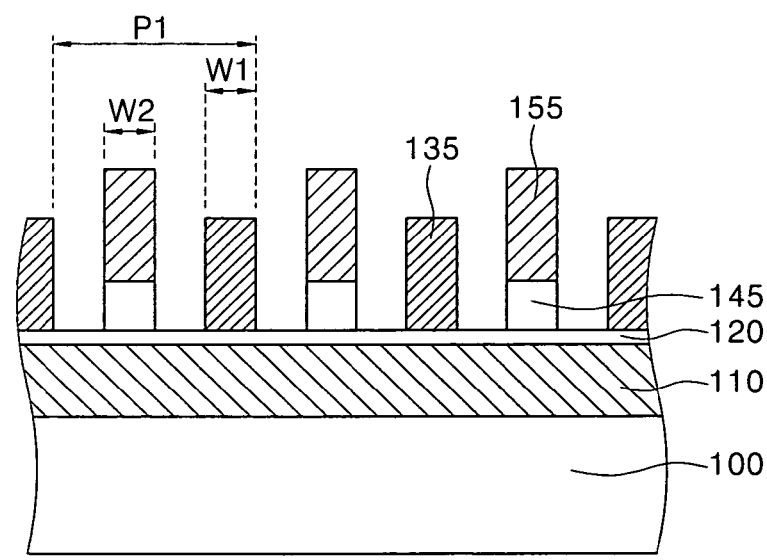

Referring to FIG. 1E, the sacrificial layer 140 may be etched using an anisotropic etching process, thereby forming a sacrificial pattern 145 under the second mask pattern 155. The anisotropic etching process may be performed on the sacrificial layer 140 using the first and second mask patterns 135, 155 as etch masks. As a result, the sacrificial layer 140 disposed between the first and second mask patterns 135, 155 may be removed, and the sacrificial layer 140 disposed under the second mask pattern 155 may remain as the sacrificial pattern 145. Also, the anisotropic etching process may expose portions of the silicon nitride layer 120.

Accordingly, a width W2 of the second mask pattern 155 may be ¼ the pitch P1 between the first mask patterns 135. Also, the width W2 of the second mask pattern 155 may be equal to the width W1 between the first mask patterns 135.

Figure 1F:
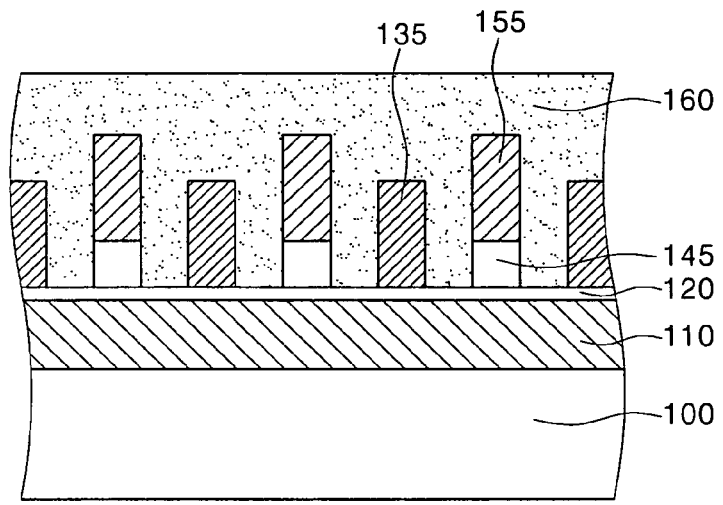

Referring to FIG. 1F, an organic sacrificial layer 160 may be formed on the substrate 100 having the sacrificial pattern 145. The organic sacrificial layer 160 may fill spaces between the second mask patterns 155 including the sacrificial pattern 145 and the first mask pattern 135. Also, the organic sacrificial layer 160 may be a photoresist to be patterned by an ArF laser, a KrF laser, or an I-line. In addition, the organic sacrificial layer 160 may be an anti-reflective coating (ARC) layer or an amorphous carbon layer.

Figure 1G:
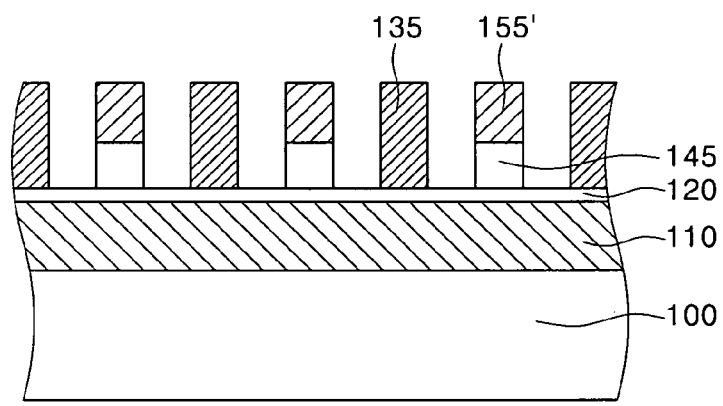

Referring to FIG. 1G, the organic sacrificial layer 160 may be etched by a CMP process or an etchback process so that the second mask pattern 155 may be over-etched. The first mask pattern 135 may also be over-etched.

In other words, the height of the second mask pattern 155 may be substantially the same as the height of the first mask pattern 135 after the CMP or etch-back process. The reference numeral 155' illustrates what may remain of the second mask pattern 155 after the etch process.

An ashing process may be performed on the organic sacrificial layer 160 interposed between the first and second mask patterns 135, 155, thereby removing the organic sacrificial layer 160 and exposing the sidewalls and upper surface of the first mask pattern 135, the sidewalls and upper surface of the second mask pattern 155, and the sidewalls of sacrificial pattern 145 disposed under the second mask pattern 155'.

Figure 1H:
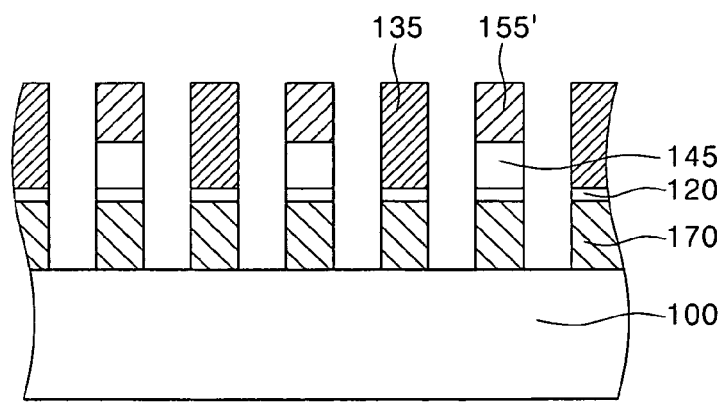

Referring to FIG. 1H, the underlying layer 110 may be etched using the first mask patterns 135 and the second mask pattern 155 including the sacrificial pattern 145 as an etch mask, thereby forming an underlying layer pattern 170. The etching process of the underlying layer 110 may be performed using an anisotropic dry etching process. A loading effect caused by a difference in height between adjacent mask patterns may be prevented, due to the fact the first and second mask patterns 135, 155 may be formed on the underlying layer on the same level as shown in FIG. 1G. In other words, the underlying layer pattern 170 formed by the anisotropic etching process may have uniform profiles.

Also, whereas the first mask pattern 135 may be formed by a photolithography process, the second mask pattern 155 may be formed between the adjacent first mask patterns 135 due to the formation of the sacrificial layer 140 and the second mask layer 150.

Although a silicon nitride layer 120 formed on an underlying layer 110 was described in example embodiments, it should be recognized that a first mask pattern 135 may be directly formed on the underlying layer 110. Also, an underlying layer 110 formed on a semiconductor substrate 100 has been described in example embodiments, but an additional layer may be interposed between the underlying layer 110 and a semiconductor substrate 100.

In the above-described process, an underlying layer pattern may be formed on a substrate. For example, when a pitch between first mask patterns approximate a resolution limit, because second mask patterns are formed between the first mask patterns, the underlying layer patterns twice as integrated as the resolution limitation may be obtained.

FIGS. 2A through 2H are cross-sectional views illustrating a method of forming an isolation trench according to another example embodiment of the present invention.

Figure 2A:
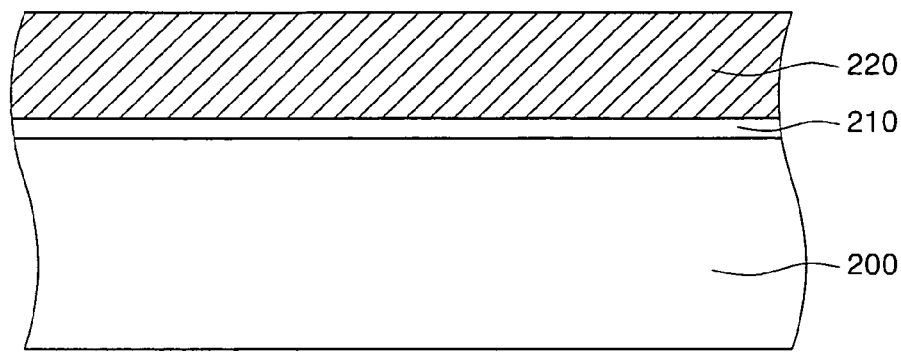
FIGS. 2A through 2H are cross-sectional views illustrating a method of forming an isolation trench according to an example embodiment of the present invention.

Referring to FIG. 2A, a semiconductor substrate 200 may be provided. A silicon nitride layer 210 and a first mask layer 220 may be formed on a semiconductor substrate 200. The first mask layer 220 may be formed of a polycrystalline silicon (poly-Si) layer or an oxide layer. The semiconductor substrate 200 may be a single crystalline silicon substrate. Also, when the first mask layer 220 is formed of poly-Si, a sacrificial oxide layer (not shown) may be interposed between the silicon nitride layer 210 and the first mask layer 220.

Figure 2B:
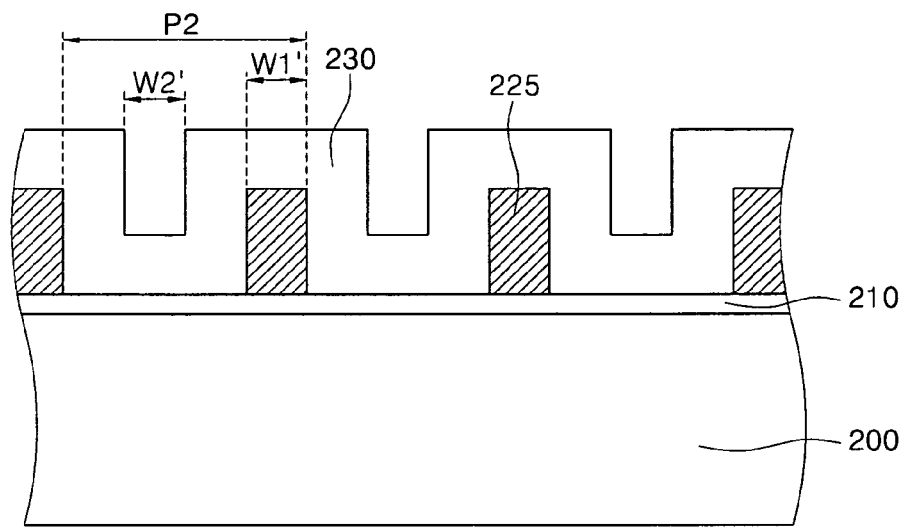

Referring to FIG. 2B, the silicon nitride layer 210 may be formed on the semiconductor substrate 200, and a first mask pattern 225 may be formed on the silicon nitride layer 210. Also, a sacrificial layer 230 may be formed on the first mask pattern 225 and exposed portions of the silicon nitride layer 210.

In detail, photoresist (not shown) may be coated on the first mask layer 220, and a typical photolithography process may be performed to form a photoresist pattern (not shown). The semiconductor substrate 200 may be dry-etched using the photoresist pattern as an etch mask, thereby forming the first mask pattern 225. The sacrificial layer 230 may be formed on the first mask pattern 225 and the exposed portions of the silicon nitride layer 210.

If the first mask pattern 225 is a poly-Si layer, the sacrificial layer 230 may be an oxide layer. If the first mask pattern 225 is an oxide layer, the sacrificial layer 230 may be a poly-Si layer.

A width W1' of the first mask pattern 225 may be ¼ a pitch P2 between the first mask patterns 225. Also, a width W2' between sidewalls of the sacrificial layer 230 may be ¼ the pitch P2 between he first mask patterns 225.

Figure 2C:
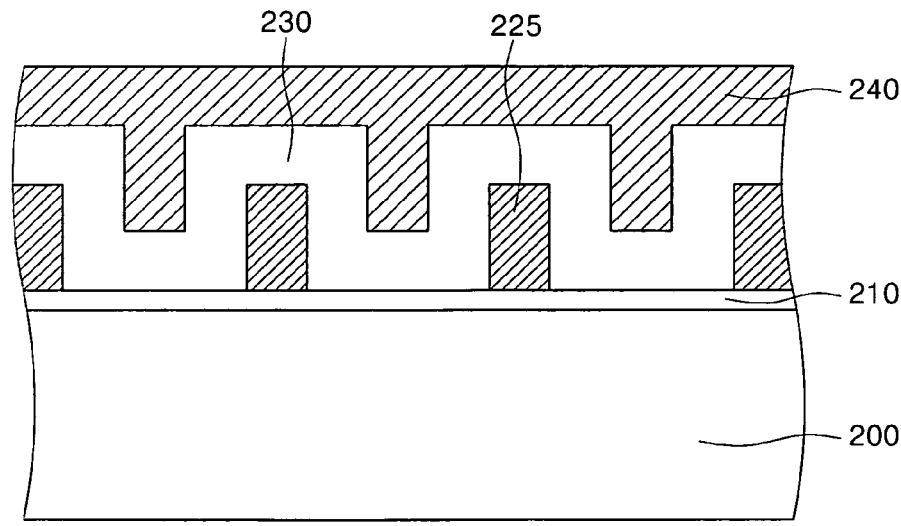

Referring to FIG. 2C, the silicon nitride layer 210, the first mask pattern 225, and the sacrificial layer 230 may be formed on the semiconductor substrate 200. A second mask layer 240 may be formed on the sacrificial layer 230.

The second mask layer 240 may be formed of a material having the same etch rate as the first mask pattern 225. The second mask layer 240 may be formed of the same material as the first mask pattern 225. In other words, if the first mask pattern 225 is a poly-Si layer, the second mask layer 240 may be formed of poly-Si, and if the first mask pattern 225 is an oxide layer, the second mask layer 240 may be formed of oxide.

Figure 2D:
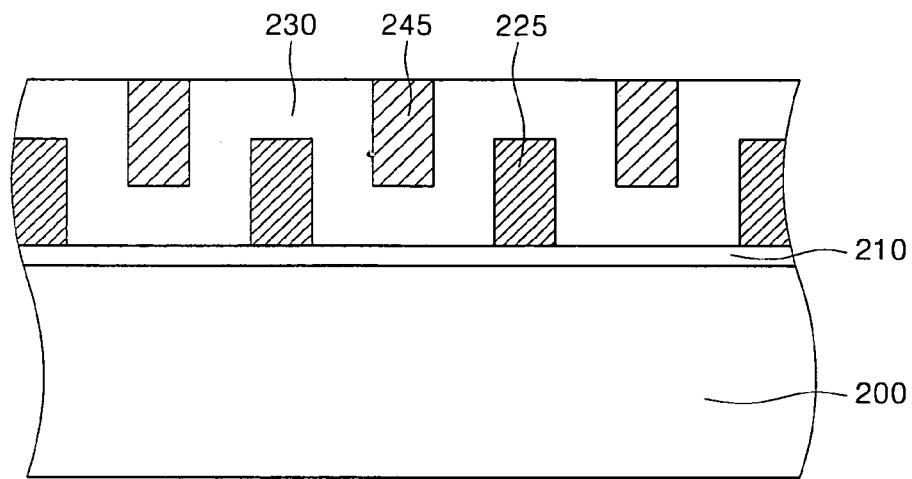

Referring to FIG. 2D, the silicon nitride layer 210, the first mask pattern 225, and the sacrificial layer 230 may be formed on the semiconductor substrate 200. A second mask pattern 245 may fill spaces between sidewalls of the sacrificial layer 230.

In detail, the second mask layer 240 shown in FIG. 2C may be etched using a CMP process or an etchback process until the second mask layer 240 is removed from the sacrificial layer 230. Thus, a second mask pattern 245 may be formed in the spaces between the sidewalls of the sacrificial layer 230.

Figure 2E:
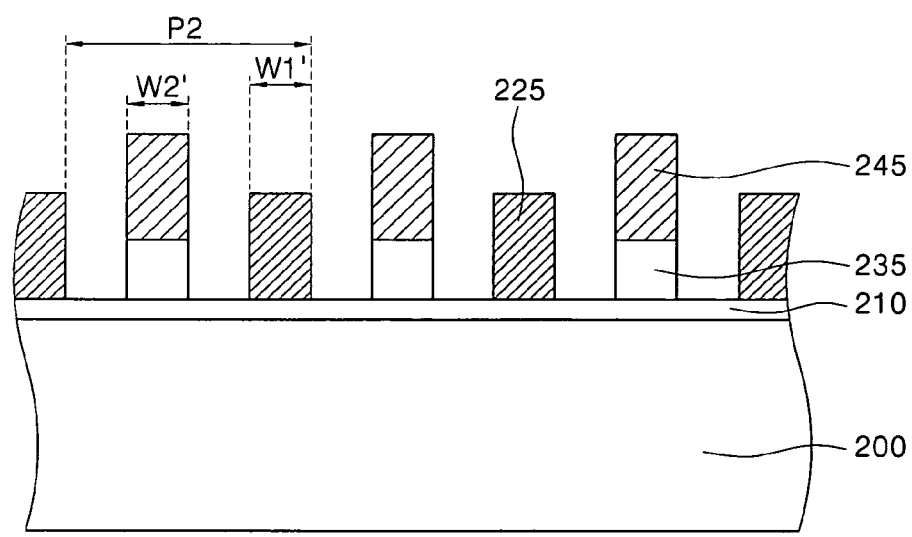

Referring to FIG. 2E, the silicon nitride layer 210, the first mask pattern 225, a sacrificial layer pattern 235, and the second mask pattern 245 may be formed on the semiconductor substrate 200. The sacrificial layer 230 shown in FIG. 2D may be etched by an anisotropic dry etching process using the first and second mask patterns 225, 245 as an etch mask, thereby forming the sacrificial layer pattern 235. During the anisotropic etching process to form the sacrificial layer pattern 235, the silicon nitride layer 210 may function as an etch stop layer.

The sacrificial layer 230 formed below the second mask pattern 245 may remain as the sacrificial layer pattern 235. Also, the anisotropic dry etching process may remove the sacrificial layer 230 disposed between the second mask patterns 245 and exposes the silicon nitride layer 210 disposed thereunder. Because the second mask pattern 245 may be formed of a material having an etch selectivity with respect to the sacrificial layer 230, the second mask pattern 245 may remain during the dry etching process. Similarly, because the first mask pattern 225 may also be formed of a material having an etch selectivity with respect to the sacrificial layer 230, the first mask pattern 225 may remain during the dry etching process. The first and second mask patterns 225, 245 may function as an etch mask during the etching process of the sacrificial layer 230.

If the first and second mask patterns 225, 245 are formed of poly-Si, and the sacrificial layer 230 may be formed of oxide. The anisotropic dry etching process may be performed using $CHF_3$ or $CH_2F_2$ as an etching gas. Also, if the first and second mask patterns 225, 245 are formed of oxide and the sacrificial layer 230 is formed of poly-Si, the anisotropic dry etching process may be performed using $Cl_2$, $O_2$, or Ar as an etching gas.

Figure 2F:
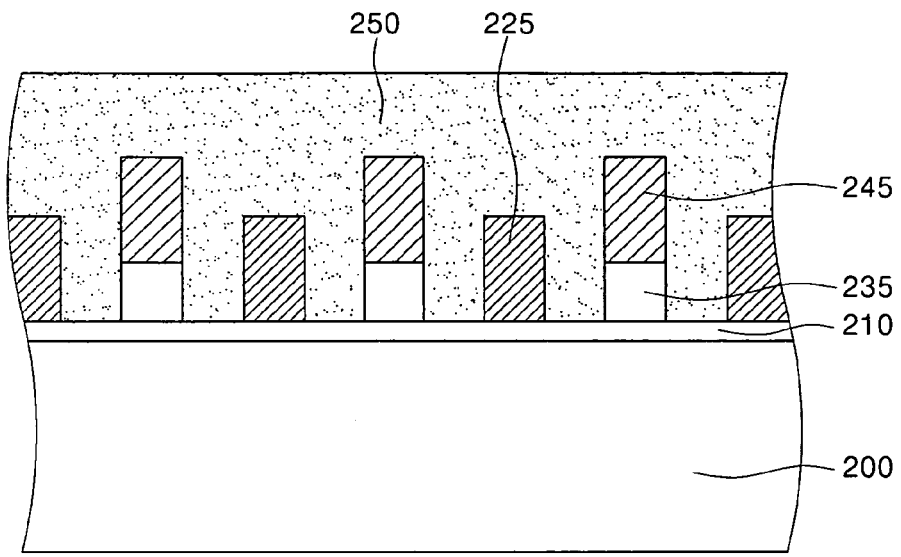

Referring to FIG. 2F, an organic sacrificial layer 250 may be formed on the silicon nitride layer 210 to fill spaces between the first mask pattern 225 and the sacrificial layer pattern 235, and the second mask pattern 245. The organic sacrificial layer 250 may be a photoresist to be patterned by an ArF laser, a KrF laser, or an I-line. In addition, the organic sacrificial layer 250 may be an ARC layer or an amorphous carbon layer. The organic sacrificial layer 250 may be formed by a spin coating process. In another example embodiment, the organic sacrificial layer 250 may be formed by a deposition process.

The organic sacrificial layer 250 may be etched by a CMP process or an etchback process so that the first and second mask patterns 225, 245 may be planarized. Once the first and second mask patterns 225, 245 are planarized, the first mask pattern 225 may have a substantially a planar top surface with respect to top surface of the second mask pattern 245.

The organic sacrificial layer 250 left after the etching process between the planarized first and second mask patterns 225, 245 may be removed by an ashing process.

Figure 2G:
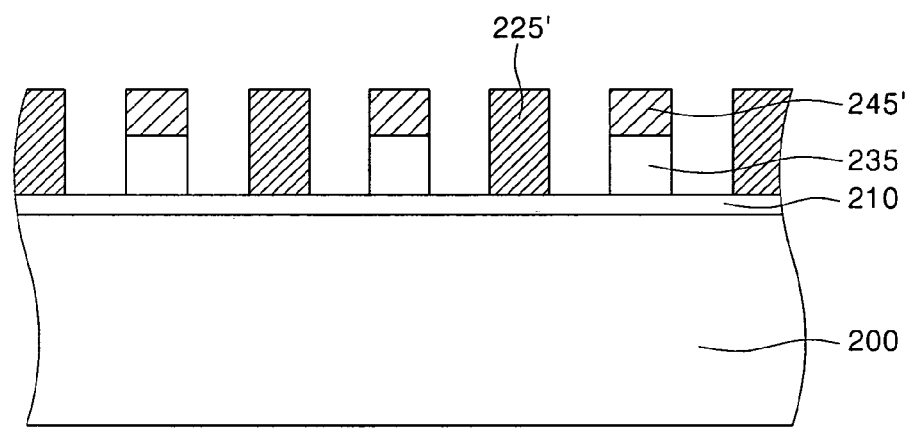

Referring to FIG. 2G, the organic sacrificial layer 250 may be completely removed by the ashing process so that the silicon nitride layer 210, the first mask pattern 225, the sacrificial layer pattern 235, and the second mask pattern 245 are formed on the semiconductor substrate 200. The numeral 245' illustrates what may remain of the second mask pattern 245 after the first and second mask patterns 225, 245 are planarized.

For example, the planarization process leads the first mask pattern 225 to form the planar surface with the second mask pattern 245'.

Figure 2H:
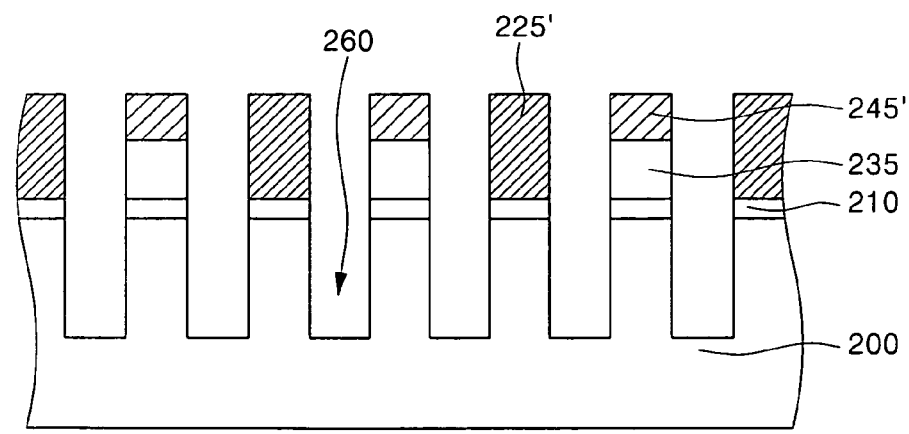

Referring to FIG. 2H, the silicon nitride layer 210 and the semiconductor substrate 200 may be etched using the first and second mask patterns 225, 245 as an etch mask, thereby forming a trench 260.

A loading effect caused by a difference in height between adjacent mask patterns may be prevented, because the top surface of the first and second mask patterns 225, 245' may be on the same level. The trench 260 formed by an anisotropic etching process may have a uniform profile.

Also, unlike the first mask pattern 225 formed by a photolithography process, the second mask pattern 245' may be formed between the adjacent first mask patterns 245 due to the formation of a sacrificial layer 230 and a second mask layer 240.

For example, when a pitch P2 between the first mask patterns 225 approximate the resolution limit, because the second mask patterns 245' may be formed between the first mask patterns 225, the trench 260 twice as integrated as the resolution limit may be obtained.

In example embodiments of the present invention as described above, during the formation, of underlying layer patterns or trenches, mask patterns may have a planar top surface by a self-aligned double patterning process. Accordingly, when an etching process is performed on an underlying layer or a semiconductor substrate, a loading effect caused by a difference in height between the mask patterns may be prevented.

Further, because self-aligned patterns may be formed between patterns with a pitch approximate to the resolution limit, underlying layer patterns or trenches twice as integrated as the resolution limit may be obtained.

Example embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the scope of the present invention as set forth in the following claims.

What is claimed is:

1. A method of forming a self-aligned double pattern, comprising:
    providing a substrate;
    forming a first mask pattern on the substrate;
    forming a first sacrificial layer on the substrate having the first mask pattern;
    forming a second mask pattern on the first sacrificial layer;
    etching the first sacrificial layer to form a first sacrificial pattern;
    forming a second sacrificial layer on the substrate having the first mask pattern, the second mask pattern, and the first sacrificial pattern;
    planarizing the second sacrificial layer such that top surfaces of the first mask pattern and the second mask pattern are planar;
    removing the second sacrificial layer; and
    performing an etching process using the first mask pattern and the second mask pattern as an etching mask.

2. The method of claim 1, further including:
    forming an underlying layer between the substrate and the first mask pattern; and
    forming an underlying layer pattern by etching the underlying layer using the first mask pattern, the second mask pattern, and the first sacrificial pattern as an etching mask.

3. The method according to claim 2, wherein forming the first mask pattern includes:
    forming an etch stop layer on the underlying layer;
    forming a first mask layer on the etch stop layer;
    forming a photoresist pattern on the first mask layer; and
    anisotropically etching the first mask layer using the photoresist pattern as an etch mask.

4. The method according to claim 2, wherein forming the second mask pattern includes:
    forming a second mask layer on the first sacrificial layer, including filling spaces in the first sacrificial layer; and
    planarizing the second mask layer.

5. The method according to claim 2, further comprising:
    prior to forming the underlying layer pattern, removing the second sacrificial layer that remains between the first and second mask patterns after the planarization of the second sacrificial layer.

6. The method according to claim 2, wherein the first mask pattern is formed of a material having the same etch rate as the second mask pattern, and the underlying layer is formed of a material having a different etch rate from the first mask pattern.

7. The method according to claim 2, wherein the first and second mask patterns are formed of the same material, and a material having a different etch selectivity from the first sacrificial layer.

8. The method according to claim 2, wherein the second sacrificial layer is an organic sacrificial layer selected from the group consisting of a Novolak-based I-line photoresist, a PHS (poly hydroxystyrene)-based KrF photoresist, an Acrylate-based ArF photoresist, and a methacrylate-based ArF photoresist.

9. The method according to claim 2, wherein the second sacrificial layer is anti-reflection coating (ARC) layer or an amorphous carbon layer.

10. The method according to claim 1, wherein forming the first mask pattern comprises:
  forming an etch stop layer on the substrate;
  forming a first mask layer on the etch stop layer;
  forming a photoresist pattern on the first mask layer; and
  anisotropically etching the first mask layer using the photoresist pattern as an etch mask.

11. The method according to claim 10, further comprising:
  forming a sacrificial oxide layer on the etch stop layer.

12. The method according to claim 11, wherein the sacrificial oxide layer remains after the first mask layer is anisotropically etched.

13. The method according to claim 1, wherein forming the second mask pattern includes:
  forming a second mask layer on the first sacrificial layer, including filling spaces in the first sacrificial layer; and
  planarizing the second mask layer.

14. The method according to claim 1, wherein the first and second mask patterns are formed of polycrystalline silicon, and the first sacrificial layer is formed of oxide.

15. The method according to claim 1, wherein the first and second mask patterns are formed of oxide, and the first sacrificial layer is formed of polycrystalline silicon.

16. The method according to claim 1, wherein the second sacrificial layer is an organic sacrificial layer selected from the group consisting of a Novolak-based I-line photoresist, a PHS (poly hydroxystyrene)-based KrF photoresist, an Acrylate-based ArF photoresist, and a methacrylate-based ArF photoresist.

17. The method according to claim 1, wherein the second sacrificial layer is anti-reflection coating (ARC) layer or an amorphous carbon layer.

18. The method according to claim 1, wherein planarizing the second sacrificial layer includes an etch back process or a chemical mechanical polishing process.

19. The method according to claim 1, wherein performing the etching process includes:
  forming a trench by etching the substrate using the first mask pattern and the second mask pattern as an etching mask.

20. The method according to claim 1, further comprising:
  prior to forming the first mask pattern, forming an underlying layer on the substrate.

21. The method according to claim 20, wherein performing the etching process includes:
  forming an underlying layer pattern by etching the underlying layer using the first mask pattern and the second mask pattern as an etching mask.

22. The method according to claim 20, wherein the first mask pattern is formed of a material having the same etch rate as the second mask pattern, and the underlying layer is formed of a material having a different etch rate from the first mask pattern.

23. The method according to claim 1, wherein the first and second mask patterns are formed of the same material, and a material having a different etch selectivity from the first sacrificial layer.

* * * * *